United States Patent [19]
Doran et al.

[11] Patent Number: 5,140,242
[45] Date of Patent: Aug. 18, 1992

[54] SERVO GUIDED STAGE SYSTEM

[75] Inventors: Samuel K. Doran, Wappingers Falls, N.Y.; Rodney A. Kendall, Ridgefield, Conn.

[73] Assignee: International Business Machines Corporation, Armonk, N.Y.

[21] Appl. No.: 516,844

[22] Filed: Apr. 30, 1990

[51] Int. Cl.⁵ .................. B66C 23/16; B23P 19/00
[52] U.S. Cl. ..................... 318/640; 318/568.2; 318/568.21; 74/479
[58] Field of Search ............... 318/560–646; 364/474.01–474.28; 250/201, 561; 356/358; 74/479; 901/3, 9, 15, 23

[56] References Cited

U.S. PATENT DOCUMENTS

| | | | |
|---|---|---|---|
| 3,786,332 | 1/1974 | Hepner et al. | 318/640 X |
| 3,889,164 | 6/1975 | Nishizawa et al. | 318/577 X |
| 4,019,109 | 4/1977 | McCoy et al. | 318/640 |
| 4,087,729 | 5/1978 | Yamazaki et al. | 318/601 |
| 4,187,051 | 2/1980 | Kirsch et al. | 318/640 X |
| 4,191,916 | 3/1980 | Zasio et al. | 318/640 |
| 4,203,064 | 5/1980 | Suzuki et al. | 318/640 |
| 4,598,242 | 7/1986 | Hayashi et al. | 318/640 |
| 4,654,571 | 3/1987 | Hinds | 318/640 X |
| 4,698,575 | 10/1987 | Bouwer | 318/640 |
| 4,742,286 | 5/1988 | Phillips | 318/640 |
| 4,812,725 | 3/1989 | Chitayat | 318/625 |
| 4,972,574 | 11/1990 | Isono et al. | 74/479 X |

*Primary Examiner*—Paul Ip
*Attorney, Agent, or Firm*—Graham S. Jones, II

[57] ABSTRACT

A positioning stage has a base which carries a stage plate slidably on its upper surface. Three rotatable drives engage both the stage plate and the base to move the stage plate on the base to provide motion along the x and y axes plus rotation. The linear drives each include a motor and a capstan driven by the motor and a drivebar frictionally coupled to the capstan. The stage is spring loaded to provide constant down-load force, regardless of the varying extension length of the drivebar. A ball joint permits varying between the cones and the ball of the ball joint dynamically to desired levels. Measurement of position is provided by integrated, parallel dual axis plane mirror interferometers.

23 Claims, 7 Drawing Sheets

SERVO GUIDED STAGE SYSTEM

BACKGROUND OF THE INVENTION

Field of the Invention

This invention is directed to a drive mechanism for accurately positioning a work stage along two axes with three degrees of freedom.

CROSS REFERENCE TO RELATED APPLICATION

U.S. application Ser. No. 516,848, filed Apr. 30, 1990 entitled "Two Axis Plane Mirror Interferometer", filed contemporaneously herewith, by R. A. Kendall and assigned to the assignee of this application, and incorporated herein by reference.

U.S. application Ser. No. 516,658 filed Apr. 30, 1990, now U.S. Pat. No. 5,052,844 entitled "Ball Joint with Dynamic Preload Adjustment", filed contemporaneously herewith, by R. A. Kendall and assigned to the assignee of this application, and incorporated herein by reference.

Related Art

U.S. Pat. No. 4,528,490 of Hansen for "Two Axis Drive for Stage" includes a base plate and an additional pair of stacked plates, one known as a stage plate and the other as an intermediate plate (20). Each plate is driven by a drive. The intermediate plate (20) is driven by drive bar (42) along a linear direction with respect to the base plate. A drive means for the stage plate includes a motor driven capstan, and a drive bar (66) has angular freedom of movement, i.e. is pivotally mounted under stage plate (12). The stage plate (12) is thus free to move along a second path and to rotate.

J. Reed et al "High Speed Precision X-Y Stage", J. Vac. Sci. Technol. B, Vol. 3, No. 1 pp. 112 et seq., (Jan./Feb. 1985) describes conventional linear ways and ball bearings but "incorporates a unique capstan/swinging drive bar design to couple the servomotors and the X and Y stage elements." The stage involves three stacked plates coupled to one another by crossed linear bearings. The bottom plate is affixed to a base. The center plate is fixed rigidly to its drive bar through a preloaded duplex bearing (FIG. 2). The drive bars are driven by a servomotor via a friction-drive capstan.

S. Ido et al "Precision X-Y Stage for Electron Beam Lithography System" pp 267-268 Bull. Japan Soc. of Prec. Eng. Vol. 18, No. 3 (September 1984) describes a stacked X-Y stage configuration with hydrostatic bearings.

Kallmayer et al "X-Y Table" IBM Technical Disclosure Bulletin Vol. 30, No. 7 (December 1987), pp. 376-377 shows three rigidly mounted spindle drives with stators 1, 2, and 3 affixed to a rigid support so they do not pivot relative to the table 4, so the flexibility of the drives is limited by their rigid mounting to a restricted range of motions afforded by the guides 10 and 11 in the slots in the table 4. In addition, two of the spindle drives 1 and 2 are parallel to each other. Laser interferometers referred to in that article as 5, 6 and 7 and mirrors 8 and 9 are used to measure displacement.

Tsuyuzaki et al J. Vac. Sci. Technol. B, Vol. 4, No. 1 p28X, (January/Feburary 1986) describes a plate structure or "planar" stage with X-Y motion accuracy imparted via machined guide slots in the base and substrate positioning table. An X-Y cross structure is placed within these slots between the top table and the base. A low friction polymeric material such as PTFE is employed as a bearing surface.

Figure 3:
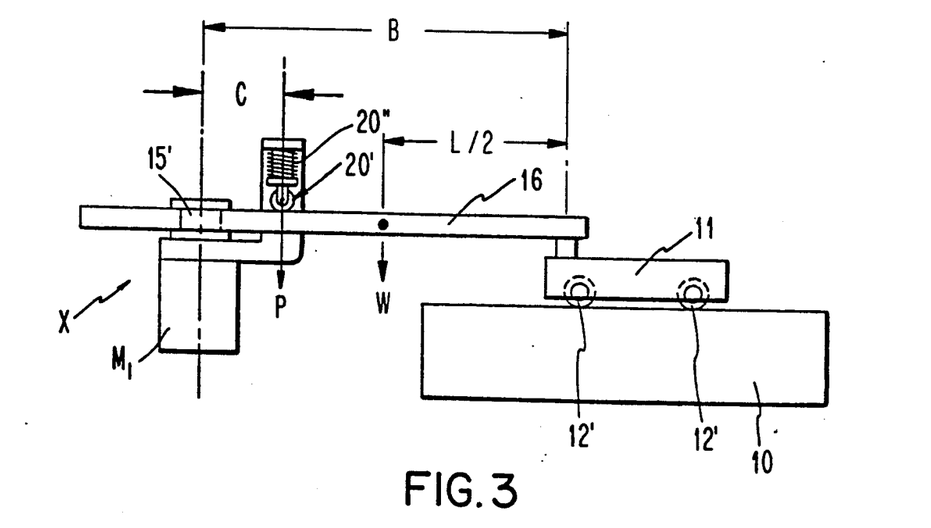
FIG. 3 shows a preload roller which has been added to the drivebar system of FIG. 2.

Constant Download Friction Drive System, IBM Technical Disclosure Bulletin, Vol. 32, No. 8A, (January 1990) pages 120-121 describes a method and apparatus for cancelling the variation in download exerted by the end of a drivebar system by preloading the drivebar as shown in FIG. 3 herein.

Ball Joint Pivot with Dynamic Preload

Discussion of Related Art

Ball type pivot joints provide multiple degrees of freedom about a point at the center of a ball of spherical shape. Heretofore, ball joints have included two basic types including as follows:
(1) Spring-loaded joints and
(2) Spherical bearings.

Spring-loaded ball joints include a pair of cones or sockets which are tightened against the ball to eliminate backlash.

A disadvantage of that system is that when using high preloads for high linear stiffness, there is considerable friction and wear between the ball and the cones or sockets.

The spherical bearing ball joint relies on closely matched inner and outer spherical bearing elements. This type of ball joint has high linear stiffness and low friction, but by the nature of this design must operate with a small clearance between the inner and outer bearings. Such a small clearance increases with wear and the backlash associated with this clearance makes it unsuitable for micropositioning applications.

SUMMARY OF THE INVENTION

A positioning stage comprises (a) a base; (b) a stage plate slideably supported on said base, (c) at least three linear drive means rotatably engaging both the stage plate and rotatably engaging the base for moving the stage plate on a path with at least three separate drive displacements along the rectilinearly disposed x and y axes and rotation of the plate on the base substantially parallel to the surface of the base, the plate moving upon the surface of the base, whereby combined x, y rectilinear and rotary motions with respect to the base can be achieved. The positioning system includes an interferometer system including an integrated structure including a plurality of interferometer optical systems on a unitary element the system including integrated, parallel, dual two axis plane mirror interferometers in the unitary element.

Preferably the stage includes as follows: a) a first one of the linear drive means is directed in a first direction substantially along the x axis, b) a second one of the linear drive means is directed substantially along the y axis transverse to the direction of the first linear drive means, and c) a third one of the linear drive means is substantially parallel to one of the first and second linear drive means for providing rotation through the angle theta, whereby displacement of the stage can be provided in the x, y and rotational directions of motion relative to the base as the three linear drive means independently operate to translate the stage through linear and/or rotary motion with respect to the base.

In still another aspect the stage preferably includes as follows: a) each of drive means on the base being connected to the stage plate for moving the stage plate as a function of its force, b) the drive means including a motor and a capstan driven by the motor, c) a drivebar and pressure means, d) the capstan and the pressure means cooperating to drive the drivebar in response to the motor, e) the drivebars being pivotally mounted on the stage plate and frictionally engaged with the capstan by the pressure means; whereby rotation of the capstan moves the stage displacements provided by the independent drive means.

In another aspect, the stage includes a) each of drive means on the base being connected to the stage plate for moving the stage plate as a function of its force, b) the drive means including a motor and a capstan driven by the motor, c) a drivebar and pressure means, d) the capstan and the pressure means cooperating to drive the drivebar in response to the motor, e) the drivebars being pivotally mounted on the stage plate and frictionally engaged with the capstan by the pressure means; whereby rotation of the capstan moves the stage plate along a path as a function of the at least three displacements provided by the independent drive means.

In another aspect of the invention, a positioning system for a stage comprises: a) a base; b) a stage plate slideably supported on the base, c) at least three linear drive means rotatably engaging the stage plate and rotatably engaging the base for moving the stage plate on a path with at least three separate drive displacements motions upon the surface of the base for moving the plate upon the surface of the base, d) means for detecting the displacement of each of the linear drive means, e) control electronics means for providing control signals having inputs connected to the means for detecting and having outputs connected to the linear drive means, whereby combined rectilinear and rotary motion with respect to the base can be achieved.

In the past the x, y drives for supporting work to be machined have been limited to the use of stacked stages for x and y displacement with one on each level of the stack. A guide track is required for each level. A serious problem of alignment of the tracks and bearing adjustment limits the long term accuracy and serviceability of such a system.

In addition with more demanding tolerances with decreasing size of chips, etc., the effects of thermal coefficients of expansion are becoming more and more a limiting factor. Rotation through a substantial angle theta on the surface of the base carrying the stage is also a problem for these systems. Such rotation is required where the rails or the bearings of prior art systems cause misalignment.

A positioning stage includes a base, a stage plate slideably supported on the base, at least three linear drives rotatably engaging both the stage plate, and the base for moving the stage plate on a path with at least three separate drive displacements parallel to the surface of the base, with the plate moving upon the surface of the base. This stage provides combined rectilinear and rotary motion with respect to the base.

Preferably, a first one of the linear drive means is directed in a first direction, a second one of the linear drive means is directed substantially transverse to the direction of the first linear drive means and a third one of the linear drive means is substantially parallel to one of the first and second linear drive means. In this way, displacement of the stage can be provided in the x, y and rotational directions of motion relative to the base, as the three linear drive means independently operate to translate the stage through linear and/or rotary motion with respect to the base.

A ball joint in accordance with a preferred embodiment of this invention provides the ability to alter the preload between the cones and the ball of the ball joint dynamically to desired levels. This is a very significant advantage for use in micro-positioning applications such as an X-Y stepper stage. When the stage or other device is in motion, the preload can be reduced to provide low friction and wear. When the stage or other device is not in motion, then the preload can be increased to provide zero backlash and high stiffness.

A ball-type pivot joint with dynamic preload adjustment includes a ball and a pair of cones which are dynamically preloaded by servo (feedback) control of a preload actuator. Alternate designs are limited by manufacturing and assembly tolerances as well as wear of bearing surfaces or are subject to change due to thermal fluctuations.

BRIEF DESCRIPTION OF THE DRAWINGS

FIG. 10 also shows rotation of the stage plate about an angle Theta.

FIGS. 11, 12 and 13 show three alternative arrangements for a ball joint in accordance with this invention with conical bearings therefor for use in the linkage between one of the drivebars and the stage plate.

Description of the Preferred Embodiment

Figure 1:
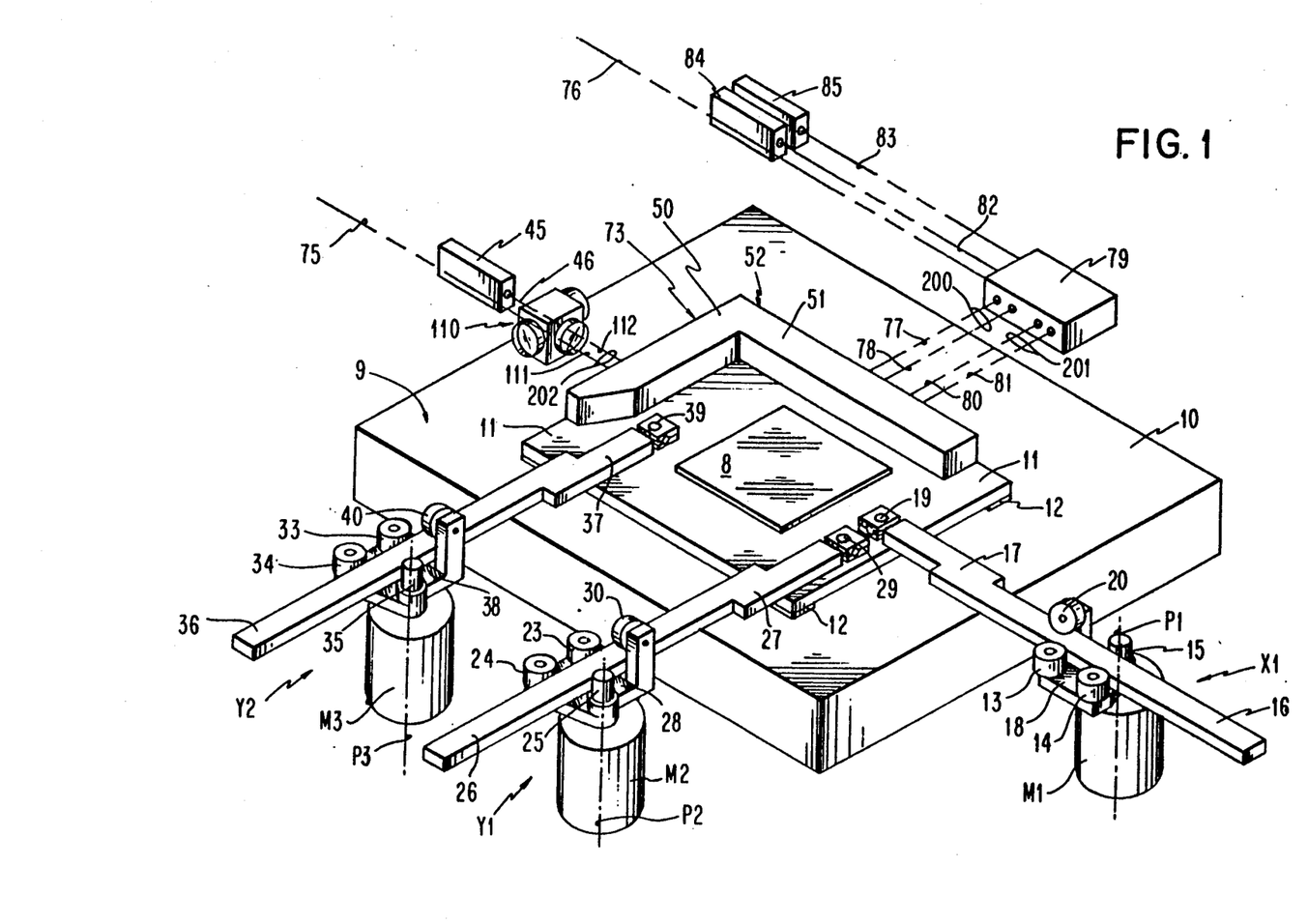
FIG. 1 is a perspective view of an x,y, theta stage plate and a plurality of linear drives including drivebars driven by friction drive units and a control system for positioning the stage plate.

Referring to FIG. 1, a base 10 supports a stage plate 11, adapted for carrying a work piece 8 slideably supported for moving on the upper surface of the base 10. The plate moves along the rectilinear x and y axes which rest substantially parallel with the flat surface of base 10. Base 10 is preferably a very flat, massive stable table composed of a material such as granite, ceramic or steel with a highly polished, extremely flat planar upper surface 9 which carries the X-Y stage plate 11, with plate 11 supporting on its upper surface a work piece 8. The lower surface of stage plate 11 is slideably supported on the upper surface 9 of base 10 by low friction supports such as feet 12 composed of a low friction polymeric material such as PTFE (polytetrafluoroethylene) or, alternatively, the feet 12 can be replaced by equivalent support bearings such as air bearings or roller bearings.

To the X-Y stage plate 11 there are pivotably secured three linear, friction drive units X1, Y1 and Y2. The drive unit X1 includes a drive motor M1 which is located along one side of base 10 and the Y1 and Y2 include drive motors M2 and M3 which are located along the adjacent side of base 10 spaced well apart from each other to provide three degrees of freedom to the stage plate 11. The transmission of power for drive unit X1 on one side of the X1-drivebar 16 (composed of ceramic or steel material) is provided by two pinch rollers 13 and 14 and a capstan 15 driven by motor M1. The X1 drive capstan 15 is located on the opposite side of X1-drivebar 16 from pinch rollers 13 and 14 so that a friction drive is provided by the capstan 15 and the two rollers 13 and 14. Preload roller 20 presses down on the top of X1-drivebar 16. Pinch rollers 13 and 14 as well as drive capstan 15 and roller 20 are mounted on carriage 18 to rotate about pivot P1 along the axis of the shaft of the motor of drive unit X1 to permit pivoting of drivebar 16. The rollers 13 and 14 on one side and the capstan 15 on the other side exert opposing forces which act together to provide friction drive engagement of the capstan 15 with drivebar 16 for reciprocating it longitudinally as capstan 15 turns while concomitantly permitting the drivebar 16 and the carriage 18 carried on the shaft of capstan 15 and rollers 13 and 14 to pivot about the axis P1 of the shaft of the capstan 15, thereby permitting rotation of the drivebar 16 on carriage 18 and the shaft of capstan 15. Drivebar 16 is offset at its inner end 17 where it connects to a linkage including pin 19 secured to stage plate 11 to secure the drivebar 16 to stage plate 11.

The position of the stage plate 11 is measured by a laser interferometer system with a pair of bars 50 and 51 secured to two orthogonal sides of plate 11 opposite from the drive units X1, Y1 and Y2. Each of bars 50 and 51 has a mirrored surface 73 and 52 respectively for measuring the X axis and Y axis displacements of stage plate 11. Laser beam 76 is provided to interferometer 79 which produces beams 77, 78, 80 and 81 which emanate from interferometer 79 towards mirror 52 and which are reflected back from mirror 52 to the interferometers 79 which produces output beams 82 and 83 which pass to receivers 84 and 85 from the interferometers 79. Receivers 84 and 85 as well as receiver 45 are optical-to-electrical transducers for converting the laser signal to electronic signals. The receivers 84, 85 and 45 include a lens which focuses the laser beam onto an active chip of a silicon photodiode. Each receiver (which can be a commercially available product such as the Hewlett Packard 10780A receiver), includes a photodetector, an amplifier and level translator, a line driver, a level sensor (comparator) and local voltage regulators. The receivers 84, 85 and 45 convert the Doppler-shifted laser light into electrical signals that can be processed by the electronic system. This is done to determine the position of mirror 52 along the Y axis, measured from the opposite side of the plate 11 from the Y1 and Y2 drive units. Beam 75 passes through interferometer 110 producing beams 111 and 112 which measure the X axis position of a point on mirror 73 by reflection of beams 111 and 112 from mirror 73 to interferometer 110 which produces an output beam 46 directed at receiver 45.

Theta Angle Measurement Apparatus

With respect to measurement of Theta motion by the laser interferometer system, within a small range of angles sufficient for applications such as VLSI semiconductor chip manufacture, the interferometer apertures are wide enough to receive the beams as the angles of reflection change. For greater angles of rotation, the system can employ a system of markings upon the drivebars which will give absolute positions of the drivebars with respect to their linear drives.

Constant Download Friction Drive System

Figure 2:
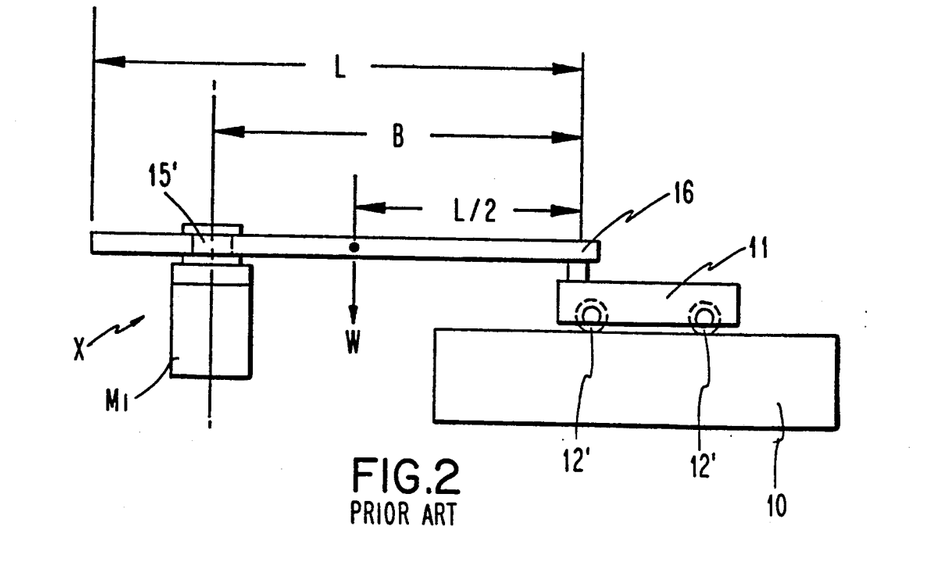
FIG. 2 shows an example of a prior art drivebar system.

FIGS. 2 and 3 illustrate how the variation in download exerted by the ends of drivebars 16, 26 and 36 is minimized.

Friction drive units are frequently used in mechanical systems for highly precise positioning of components such as work pieces and the like. A problem with such systems is that the download of the drivebar upon the driven component varies with the cantilevered extension of the drivebar along its path.

FIG. 2 shows an example of a prior art drivebar system. If a drivebar 16 of length L and weight W is extended by a distance B beyond where it is supported by a friction drive unit X with a capstan 15' contacting drivebar 16 at the drive point, it will exert a force of $W(B-L/2)/B$ on the driven object: stage plate 11. The stage plate 11 is shown supported on rollers 12' in this modified embodiment. It is assumed that the center of gravity of the drivebar 16 is at $L/2$, but this is not necessary. The variation of the download force causes a variation in the strain or distorting of the driven object. If the object is driven off center, a varying pitching moment is also applied to the load. It should be noted that a download force at the end of the drivebar 16 is not necessarily a disadvantage because it can be used as a preload. It is the variation in the download force as a function of the extension of the drivebar 16 which causes the problem.

FIG. 3 shows a preload roller 20' which is added to the drivebar system of FIG. 2. The preload-roller 20' under the force of a spring 20" exerts a force P preloading the drivebar 16 at a distance C from the drive point and exerts a force $PC/B$ on the driven object. (While a spring 20" is preferably employed as shown in FIG. 3, in the embodiment of FIG. 1 the spring has been omitted from FIG. 1, for convenience of illustration.) If the product PC equals $WL/2$, then the download force at the distal end of drivebar 16 where it connects to the driven object: stage plate 11 does not change materially as the drivebar 16 extends and retracts. The product PC is a torque exerted about the drive point. Means other than a preload-roller 20' can be used to create this torque.

Figures 4, 5, 6:
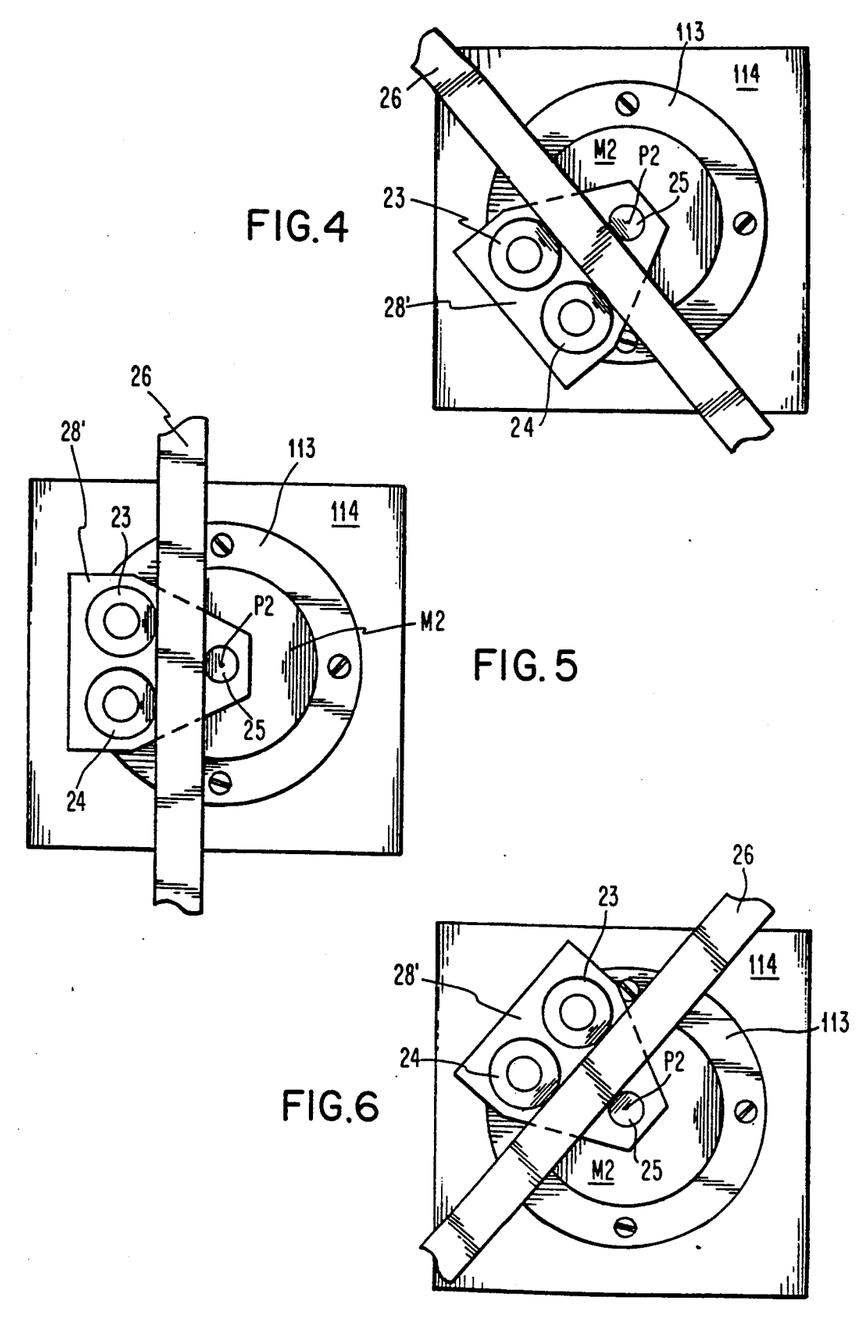
FIG. 4 shows a detailed plan view of a capstan and pinch rollers for driving a drivebar in a first diagonal position.
FIG. 5 is a variation of FIG. 4 in which the drivebar is shown in a vertical position after rotation of the capstan and pinch rollers about the axis of the capstan.
FIG. 6 is a further variation of the drive of FIG. 5 where the drivebar has been rotated to the opposite diagonal position.
Figures 7, 8:
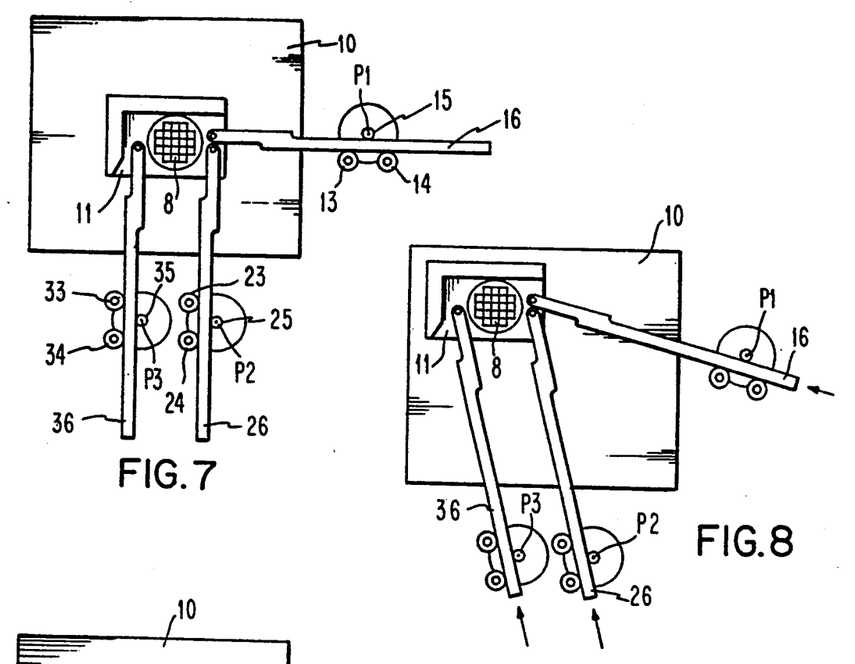
FIGS 7-10 show plan views of the stage of FIG. 1 which have been simplified for the purpose of illustrating the way in which drivebars in accordance with this invention can be driven linearly to locate the stage plate anywhere on the base supporting it.
Figures 9, 10:
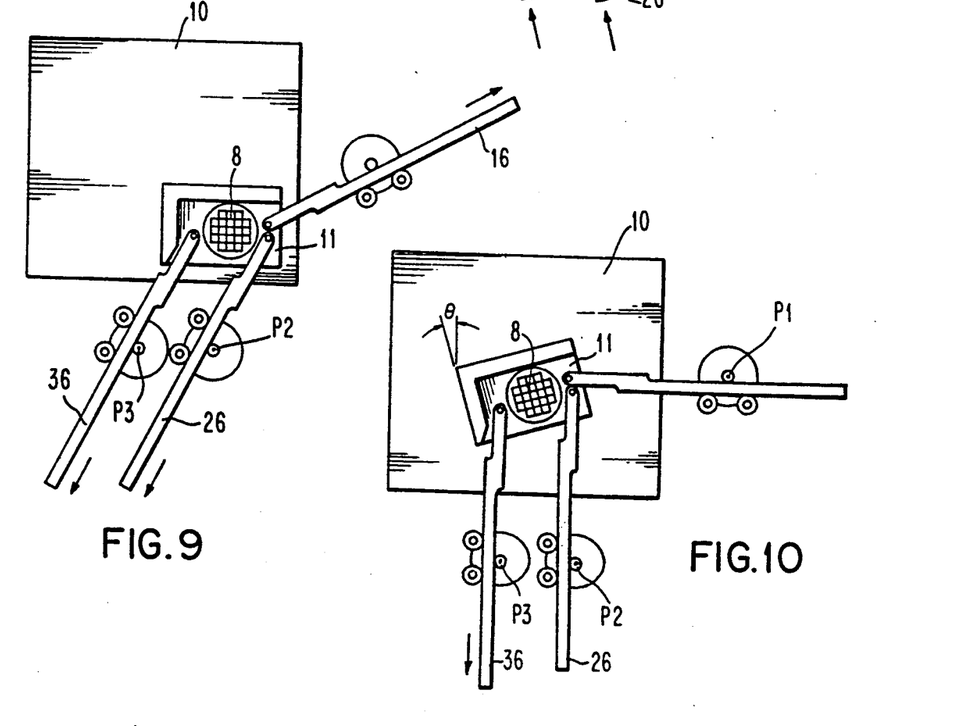

FIGS. 4, 5 and 6 are simplified illustrations of the rotatable carriages 28' (similar to carriages 18, 28 and 38 in FIG. 1) carrying elements of a friction drive adapted to produce linear motion of one of the drivebars 16, 26, and 36 showing one of the rotatable drive capstans 15, 25 and 35. In this case capstan 25, which is turned by motor M2, is holding the drivebar 26 between the side of capstan 25 and the sides of pinch rollers 23 and 24. The capstan 25 is supported on a shaft (not shown) which has a bearing within carriage 28' which has been modified in that the preload roller 30 has been omitted for ease of illustration. Carriage 28' rotates about the shaft carrying capstan 25 so that the drivebar 26 can rotate from the position in FIG. 4 where it is rotated from a diagonal orientation to a vertical position in FIG. 5 to a reverse diagonal position in FIG. 6. It should be noted that for the X1-drivebar 16, FIG. 4 is analogous to FIG. 9, FIG. 5 is analogous to FIG. 7 and FIG. 6 is analogous to FIG. 8.

X, Y, Theta, Three-Linear-Drivebar System

X1-drivebar 16 reciprocates in general in parallel with the X axis as indicated in FIG. 1, with rotation about P1 axis away from parallel with the x axis to afford enhanced flexibility of being able to provide positioning of pin 19 and stage plate 11 anywhere within predetermined boundaries of base 10. As can be seen in FIGS. 7-10, the plate 11 can be rotated through an angle theta (as shown in FIG. 10) with respect to the X and Y axes using the three drive assemblies of FIG. 1 in cooperation, where the displacement of drivebars 26 and 36 is unequal.

FIGS. 7-10 show plan views of the stage of FIG. 1 which have been simplified for the purpose of illustrating the way in which drivebars 16, 26 and 36 in accordance with this invention can be driven linearly to locate the stage plate 11 anywhere on the base 9 supporting it.

FIGS. 7-9 illustrate the capacity of the drive to position the stage plate 11 in the four remote positions on the base 10. FIG. 10 shows rotation of the stage plate 11 about an angle Theta.

FIGS. 7-10 show plan views of the table of FIG. 1 which have been simplified for the purpose of illustrating the way in which the three drivebars 16, 26 and 36 can be driven linearly to locate the stage plate 11 anywhere on the base 10. The work piece 8 shown represents a wafer with chips indicated by squares on the work piece 8. Rotation through angle Theta is shown by FIG. 10.

In FIG. 7, all the drivebars 16, 26 and 36 are approximately half way extended with the X1-drivebar 16 horizontally oriented, parallel to the X axis, and the Y-drivebars 26 and 36 vertically oriented parallel to the Y axis.

FIGS. 8 and 9 illustrate movement of plate 11 and work piece 8 to two opposite corners of the base 10 and it is obvious that the other two corners can be reached by analogous operation of the drivebars. To move the plate 11 to the left, the X1-drivebar 16 is driven to the left. To move plate 11 to the right x-1 drivebar 16 is driven to the right. In each case, the drivebars 26 and 36 will pivot about the pivots P2 and P3.

In FIG. 8, drive unit X1 and drivebar 16 have been drivebars 26 and 36 have been rotated counter-clockwise. All three drivebars 16, 26 and 36 have been extended to their fullest extension to move the stage plate 11 to its distal position, i.e. farthest from the three drive units X1, Y1, and Y2.

In addition, to move the plate 11 to the upper left, drivebar 16 is driven to the left and drivebars 26 and 36 are driven upwardly, with the drivebar 16 rotating clockwise about axis P1, and drivebars 26 and 36 rotating counter-clockwise about pivots P2 and P3, as shown in FIG. 8.

To move the plate 11 to the lower right of the base 10 as shown in FIG. 9, the drivebars 26 and 36 are retracted downwardly to near their lowest excursion with the drivebar 16 rotated counter-clockwise from its positions in FIGS. 7 and 8, and with drivebars 26 and 36 rotated to their clockwise extreme positions. To move to the lower left of base 10, the drivebars 26 and 36 will be rotated to their counter-clockwise extremes as the drivebar 16 is moved to the left along the X-axis, rotating slightly clockwise to move the plate 11 to its proximal position.

In FIG. 9, drive unit X1 and drivebar 16 have been rotated counter-clockwise. Drive units Y1 and Y2 as well as drivebars 26 and 36 have been rotated clockwise. All three drivebars 16, 26 and 36 have been retracted to their shortest extension to move the stage plate 11 to its proximal position, i.e. nearest to the three drive units X1, Y1, and Y2.

In FIG. 10 the rotation from the position in FIG. 7 has been achieved by driving the second Y-axis drive 36 downwardly while holding the first Y-axis drivebar 26 and the X1-axis drivebar 26 stationary.

Pinch rollers 23 and 24 cooperate with capstan 25 to provide friction drive engagement with drivebar 26 which is secured at inner end 27 to pin 29 which connects the drivebar 26 to stage plate 11. Pinch rollers 23 and 24 as well as drive capstan 25 and roller 30 are mounted on carriage 28 to rotate about pivot P2 along the axis of the shaft of the motor M2 of drive unit Y2.

Pinch rollers 33, 34 cooperate respectively with capstan 35 to engage with drivebar 36 which is secured at inner end 37 to pin 39 which connects the drive unit Y2 to stage plate 11. Pinch rollers 33 and 34 as well as drive capstan 35 and roller 40 are mounted on carriage 38 to rotate about pivot P3 along the axis of the shaft of the motor of drive unit Y1.

Ball Joint Pivot with Dynamic Preload

A ball-type pivot joint in accordance with this invention employs dynamic preload adjustment of the ball joint. The ball joint includes a ball and a pair of cones which are dynamically preloaded by servo (feedback) control of a preload actuator. Alternate designs are limited by manufacturing and assembly tolerances as well as wear of bearing surfaces or are subject to change due to thermal fluctuations.

Ball type pivot joints provide multiple degrees of freedom about a point at the center of a ball of spherical shape. Heretofore, ball joints have included two basic types including spring loaded joints and spherical bearings.

Spring loaded ball joints include a pair of cones or sockets in which the springs press the cones or sockets against the ball to eliminate backlash. A disadvantage of that system is that when using high preloads for high linear stiffness, there is considerable friction and wear between the ball and the cones or sockets.

The spherical bearing ball joint relies on closely matched inner and outer spherical bearing elements.

This type of ball joint has high linear stiffness and low friction, but by the nature of its design must operate with a small clearance between the inner and outer bearings. Such a small clearance increases with wear and the backlash associated with this clearance makes it unsuitable for micropositioning applications.

The joint in accordance with a preferred embodiment of this invention provides the ability to alter the preload between the cones and the ball dynamically to desired levels. This is a very significant advantage for use in micro-positioning applications such as an X-Y stepper stage. When the stage or other device is in motion, the preload can be reduced to provide low friction and wear. When the stage or other device is not in motion, then the preload can be increased to provide zero backlash and high stiffness.

Figure 11:
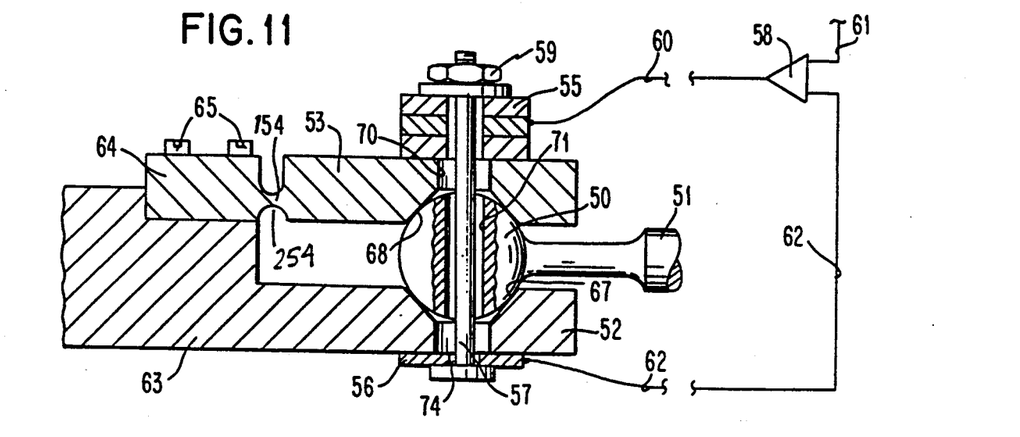
FIG. 11 shows a partially sectional view of a ball joint linkage with an automatically controlled actuator for preloading the ball joint.
Figure 12:
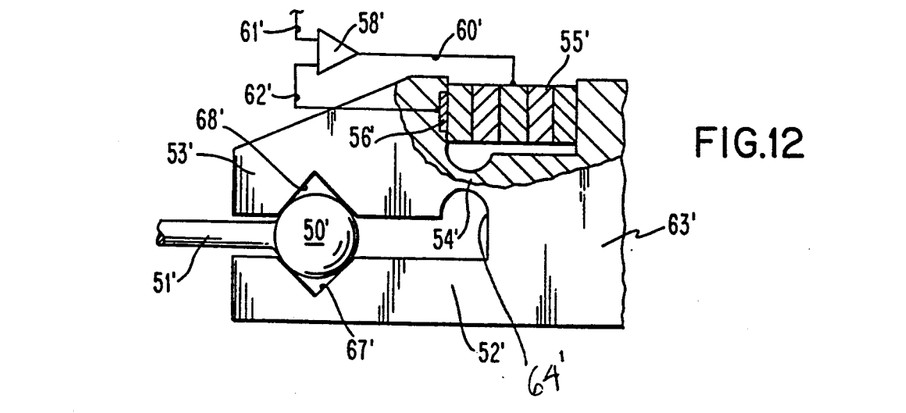
FIG. 12 is a modification of the ball joint linkage of FIG. 11.
Figure 13:
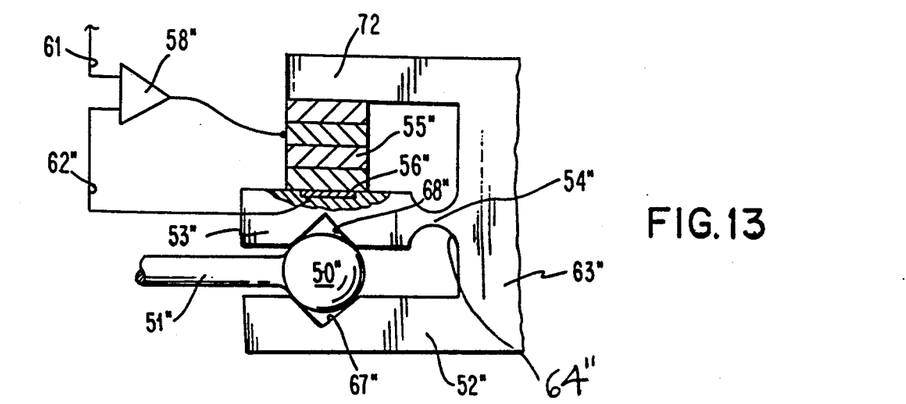
FIG. 13 is another embodiment of the ball joint linkage analogous to FIG. 12 but the structure for applying force to the cones and the ball in the joint is modified.

This is achieved using the arrangement depicted in FIGS. 11-13. Referring to FIG. 11, a drive rod 51 (having a round cross section at the end) with a ball end 50 is located between two cones or sockets 67 and 68 in a fixed member 52 and a preload bar 53, respectively. The cone 67, shown in the preferred embodiment in FIG. 11 as a fixed cone 67, is affixed to an object to be moved. The preload cone 68 is formed in the lower surface of preload bar 53. Preload bar 53 is connected to flange 64, i.e. pivot end 64. The opposite ends of bar 53 are the flange 64 secured to base 63 and the main body 53 which are flexibly connected together by flexure strip 54 formed between the elongated pair of transverse slots 154 and 254. In summary, flexure strip 54 provides from an elevational point of view a flexure "point" formed between body 53 and flange 64 which forms the pivot end 64 of the preload bar 53.

Flange 64 is affixed to base 63 of fixed member 52 by threaded fasteners 65. Base 63 is a mounting plate having holes therethrough for fastening to the stage plate 11 by threaded fasteners (not shown.) The flexure pivot 54 permits preload cone 68 in member 53 to be moved through a small angle about the flexure pivot 54. Preload actuator 55 is mounted so as to provide a compressive preload force acting to press down against the preload member 53 and preload cone 68. Preload actuator 55 comprises a piezoelectric or equivalent actuator such as a pneumatic, hydraulic, voice coil actuator, or the equivalent.

The compressive preload force applied to the cones 67 and 68 and to the ball 50 by using a preload tensioning rod 57 and a preload tensioning nut 59 through a hole in the center of preload actuator 55. In addition rod 57 passes through a hole 70 in preload member 53 through the center of the preload cone 68, through ball 50 and through the fixed member 52 and the center of fixed cone 67 as well as a hole 74 in the center of a preload sensor 56 comprising a strain gauge or the equivalent such as a force gauge.

Load sensor 56 is mounted so as to detect the load on the tensioning rod 57. Line 62 connects the strain drive electronics 58 whose output is connected to the input of the piezoelectric preload actuator 55. To increase the preload force upon the ball joint, the actuator 55 is extended or increases in thickness to compress the ball joint. To reduce the preload force, the actuator is retracted or made thinner, with the servo 58 having a predetermined level programmed into it electronically. The preload force can be altered at a frequency limited only by the bandwidth of the actuator 55. Servo 58 has another input 61 from a system controller for the purpose of setting the desired level of preload.

Although FIG. 11 shows a system using a tensioning rod 57 and a closed-loop servo system, other arrangements can be employed to provide dynamic preload adjustment forces on a ball-type pivot joint.

FIG. 12 shows a modified embodiment of this aspect of the invention where a drive rod 51' with a ball end 50' is located between two cones or sockets 67' and 68' in fixed member 52' and wedge-shaped preload lever 53'. Those two cones are shown in FIG. 12 as a fixed cone 67' formed in the upper surface of fixed member 52', which are affixed to the object to be moved and a preload cone 68'.

The preload cone 68' is an integral part of wedge-shaped lever 53' connected integrally through a flexure pivot 54' to pivot end 64' which is integral with base 63' eliminating the need for a separate preload bar secured to the base 63'. The flexure pivot 54' permits preload cone 68' in lever 53' to be moved through a small angle about the flexure pivot 54'.

Preload actuator 55' is mounted so as to provide a preload force acting to press laterally against the preload lever 53' which drives preload cone 68' down against ball end 50'. The compressive preload is achieved without using a preload tensioning rod and nut 59 since wedge-shaped lever 53' is integral with fixed member 52'. Preload sensor 56' is mounted so as to detect the load on the wedge-shaped lever 53' from actuator 55'. Line 62' connects the electrical output from strain gauge 56' into the input of the preload servo and drive electronics 58' whose electrical output signal is connected to the input of the piezoelectric preload actuator 55'.

To increase the preload force upon the ball joint, the actuator 55' is extended or increases in thickness and to reduce the preload force, the actuator is retracted or made thinner, with the servo 58' having a predetermined level programmed into it electronically. The preload force can be altered at a frequency limited only by the bandwidth of the actuator 55'. Servo 58' has another input 61' from a system controller for the purpose of setting the desired level of preload.

FIG. 13 shows another embodiment analogous to FIG. 12 where like elements have like functions, but the structure for applying force to the cones and the ball is modified.

In this embodiment drive rod 51" has a tall end 50" located between two cones or sockets 67" and 68" in fixed member 52" and preload lever 53", respectively. Fixed cone 67" is formed in the upper surface of fixed member 52" which is affixed to the object to be moved. Preload cone 68" is formed in the lower surface of preload bar 53" connected integrally through a flexure pivot 54" to pivot end 64" which is integral with base 63' eliminating the need for a separate preload bar secured to the base 63". The flexure pivot 54" permits preload cone 68" in member 53" to be moved through a small angle about the flexure pivot 54".

Mounted, so as to provide a compressive preload force acting to press down against the preload member 53" and preload cone 68", is a preload actuator 55". The compressive preload is achieved using a preload tensioning arm 72 integral with base 63". Preload sensor 56" is mounted so as to detect the load on the bar 53" from actuator 55".

Line 62" connects the electrical output from strain gauge 56" into the input of the preload servo and drive electronics 58" whose electrical output signal is connected to the input of the piezoelectric preload actuator 55". To increase the preload force upon the bearing, the actuator 55" is extended or increases in thickness and to reduce the preload force, the actuator is retracted or made thinner, with the servo 58" having a predetermined level programmed into it electronically. The preload force can be altered at a frequency limited only by the bandwidth of the actuator 55". Servo 58" has another input 61" from a system controller for the purpose of setting the desired level of preload.

Figure 14:
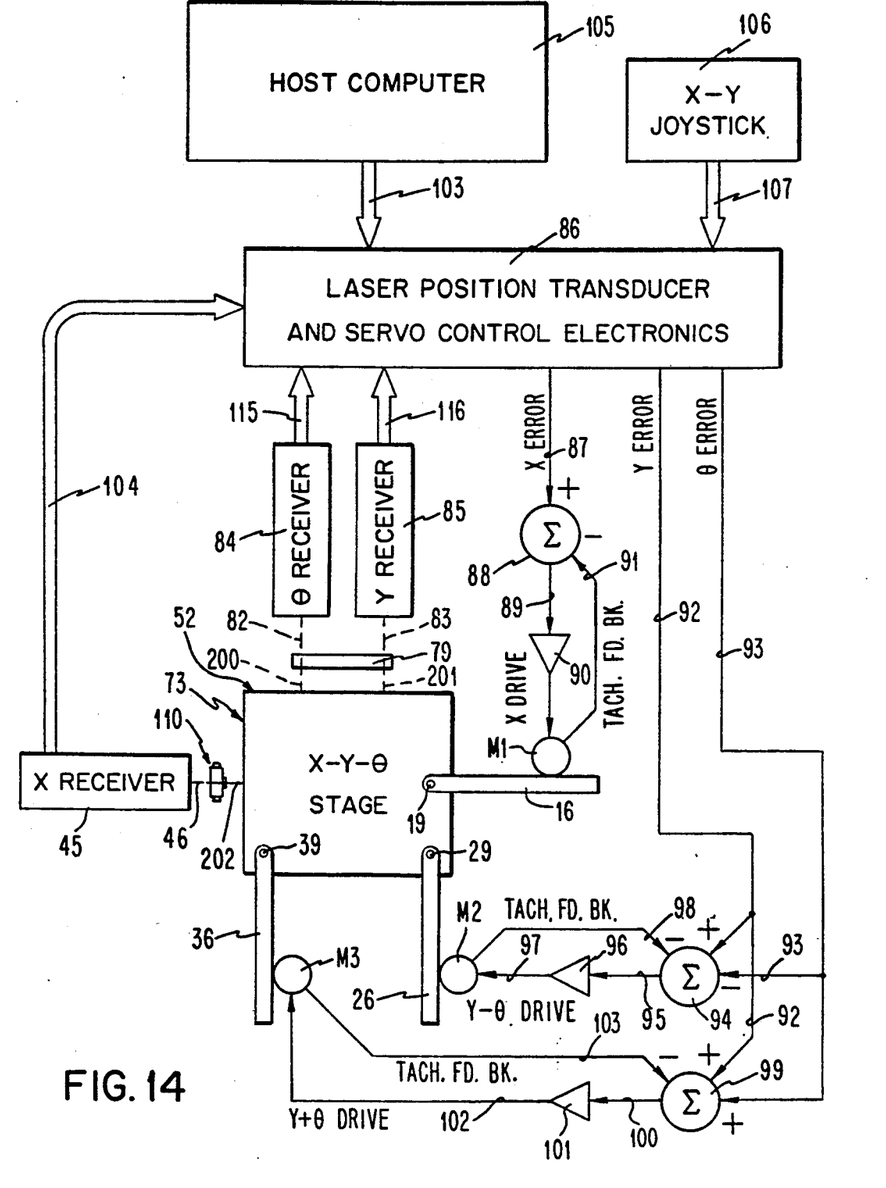
FIG. 14 shows the electrical schematic diagram of the control system for the drives employed to position the stage of FIG. 1.

FIG. 14 shows the electrical schematic diagram of the control system for the stage 11. Three identical velocity servos shown in FIG. 2 are used to move the three capstan drive units M1, M2, and M3.

When the servo control electronics 86 receives a new destination from a host computer 105 on lines 103, a series of velocity values are sent to the velocity servos of FIG. 14 to cause the stage 11 to move to the desired new destination. The closed loop position servo loop gain vs frequency and the maximum values of stage velocity, acceleration and rate of change of acceleration are controlled by stored parameters and software in the servo control electronics 86.

The velocity servos can be operated with the position servo loop opened during gaging and initialization operations when the laser beams are not activated. Also, the analog joy stick can be used for manual stage control with the Theta servo holding the Theta of the stage near zero.

Fine actuators such as piezoelectric transducers can be added to each of the three drivebars 16, 26 and 36 when higher positional and angular accuracy is required (less than 1 micrometer and 10 microradians.) This provides a coarse and a fine servo combination where the fine servo can have a higher gain bandwidth because it is driving only the mass of the stage and the payload. The mass of the drivebar and the inertia of the motors M1, M2 and M3 are outside of the fine position servo loop.

An X-Y joystick 107 also provides input to the control electronics 86 for manual control of the position of the x-y-theta stage 11.

The Laser Position Transducer and Servo Control electronics 86 receives the X position signals from the output of the X1 axis receiver 45 through cable 104. Control electronics 86 also receives the output of Y-axis receiver 85 through cable 116. Electronics 86 also receives the output of theta receiver 84 and through cable 115. Interferometer 110 employs a pair of light beams directed to target mirror 73 as shown in greater detail in FIG. 1. For the Theta and Y axis measurements by receivers 84 and 85, a pair of interferometers are housed in an integrated structure 79 in accordance with this invention as shown in FIG. 1 and FIGS. 15A–C. Laser beams 82 and 83 pass to the Theta receiver 84 and Y-axis receiver 85 respectively from the interferometers in structure 79. The interferometers operate with the target mirror 52 as explained in greater detail elsewhere in connection with FIGS. 1 and 15A-15C where the pair of light beams with FIGS. 1 and 15A-15C where the pair of light beams for each are shown, whereas in FIG. 14 they are shown as single beams 200, 201 respectively for convenience of illustration.

The electronics 86 have X1-error output 87 to the positive input of summing circuit 88 which provides an output to X-1 drive amplifier 90 which energizes motor M1 which is shown in FIG. 1. The tachometer feedback 91 is shown on line 91 which connects to the negative input of summing circuit 88 to provide negative feedback.

The electronics 86 also have a Y Error output 92 to the positive input of summing circuit 99 and summing circuit 94. Summing circuit 99 provides an output 100 to Y+Theta drive amplifier 101 which energizes motor M3 which is shown in FIG. 1. The tachometer feedback on line 103 is connected to the negative input of summing circuit 99 to provide negative feedback.

The electronics 86 further have a Theta- error output 93 to the negative input of summing circuit 94 and the positive input of summing circuit 99. Summing circuit 94 provides an output 95 to Y−theta drive amplifier 96 which energizes motor M2 which is shown in FIG. 1. The tachometer feedback 98 is shown on line 98 which connects to the negative input of summing circuit 94 to provide negative feedback.

When pure X motion is desired the host computer loads a new X destination. A series of X velocity commands are given to move the X motor M1 and drive bar 16 until the stage position error is driven to zero at the new X location. While the stage is moving in the X axis, the Y position servo is driving the Y Motors M2 and M3 to actively keep the Y position error near zero. Also during the X move Theta disturbances will occur so the Theta servo actively drives the Y motors M2 and M3 differentially to keep the YAW near zero during the move and to hold it near zero after the move.

The Theta servo maintains the Theta (YAW angle) of the stage near zero by electronically superimposing small velocity corrections 93 to the Y velocity commands 92 in summing junctions 94 and 99. The dedicated closed loop Theta servo is constantly compensating for tiny gain differences in amplifiers 96 and 101 and motors M2 and M3, inertia differences in the stage and drive bars 26 and 36 and dynamic friction differences in the bearing pads. The Theta servo also removes the Theta distrubances caused by the X drive bar 16. Since the task of maintaining a small value of Theta is accomplished by a dedicated Theta servo, the Y position servo hardware and software can be identical to the X position servo.

If a Theta value other than zero is desired, the host computer can load a Theta value into the electronics and the Y drive bars 26 and 36 will be pushed and pulled with motors M2 and M3 as required to achieve the new Theta value.

Pure Y motion can be achieved by loading a new Y destination and maintaining the same X position.

Integrated Parallel Dual Plane Mirror Interferometers

Figure 15A:
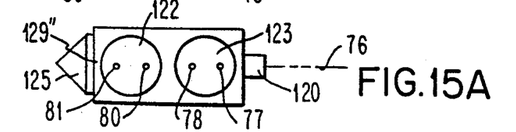
FIGS. 15A-15C show bottom, front and right side views of a pair of interferometers of the kind shown in FIGS. 1 and 2 the Y and Theta motion of the stage.
Figure 15B:
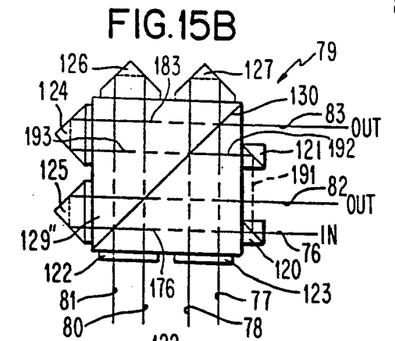
Figure 15C:
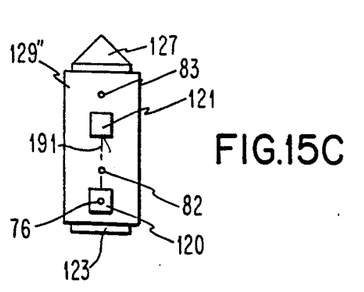

FIGS. 15A–15C show a pair of interferometers housed in an integrated structure incorporating an embodiment of parallel, dual or two axis plane mirror interferometers in accordance with this invention. Optical elements of the interferometers of FIGS. 1 and FIGS. 17A–C are bonded onto an optically transparent cubic element 129". Element 129" is composed of two bonded glass elements with a polarizing beam-splitting surface 130 joining the two halves of the cubic element 129". In other words element 129" carries bonded thereon the components of the interferometers in an integral structure. The various optical elements are bonded to the element 129" cube by means of uv cured optical cement or the equivalent.

A beam splitter 120 is bonded to the exterior of element 129" just below a beam bender 121. A laser beam 76 with combined vertical and horizontal polarization components f1, f2 is supplied to the 50% beam splitter 120 which splits the beam in half. 50% of beam 76 is directed out of splitter 120 to become beam 191 for use with one axis of the x y table. 191 is reflected up to the 90-degree beam bender 121 from which it is directed along beam path 192 into the interior of transparent element 129" As the f1, f2 components of beam 192 from bender 121 encounters beam splitting surface 130 of element 129", the f2 vertically polarized portion continues as f2 beam 193 to a retroreflector, cube corner 124. The (horizontally moving) f2 beam 193 is reflected up and over and back at right angles across cube corner 124 and is reflected back along path 183 from the opposite side of cube corner 124 through surface 130 and passes straight along path 83 out of element 129", as the f2 component of the output beam 83 to receiver 85. At the same time as the above vertically polarized f2 portion (beam 193) of beam 192 from bender 121 passes through the polarizing beam-splitting surface 130 of element 129", e.g. the horizontally polarized f1 portion of the beam from bender 121 is reflected down (along beam path 78) through a ¼ wave plate 123. Plate 123 is bonded to the lower surface of element 129". The beam 78 passes further down along beam path 78 until it reaches the mirror 52 (shown in FIGS. 1 and 14), and the beam 78 is reflected back up by mirror 52 at frequency f1+/−delta f along the same beam path 78 through ¼ wave plate 123 and surface 130 to cube corner 127 where it is doubly reflected (in cube corner 27) over to the right and back down along beam path 77 (parallel to beam path 78) through surface 130 and ¼ wave plate 123 as beam f1+/−delta f to an adjacent location on the mirror 52 until it is reflected back up as beam f1+/−2delta f a second time through ¼ wave plate 123 to beam splitting surface 130 where it is reflected because of its four ¼ wavelength changes in polarization caused by two passes through plate 123 to pass out along beam path 83, also, with the two beams f2 and f1+/−2delta f leading to beam path 83. Those two beams passing along beam path 83 one beam from cube corner 124 and a second beam from surface 130 interfere optically with each other as a function of the position of the stage 11 relative to the position of interferometer element 79, which is relatively fixed in position.

The other half of beam path 76 also composed of components f1 & f2 from beam splitter 120 for measuring the position of the second axis passes directly along beam path 176 to beam polarizing beam-splitting surface 130. There the vertically polarized f2 portion of the beam is transmitted to cube corner 125. In cube corner 125, that vertically polarized portion of the beam 176 is reflected up and over back through surface 130 out along beam path 82 to the detector 84 in FIGS. 1 and 14. The remaining, horizontally polarized portion of the beam passing along path 176 for the second axis from beam splitter 120 is reflected by the beam-splitting surface 130 down through ¼ wave plate 122 along beam path 81. The beam passes along path 81 to mirror 52 and is reflected therefrom back up beam path 81 through ¼ wave plate 122 again and through surface 130 as a result of the two trips through ¼ wave plate 122. That beam passes through to cube corner 126 where it is doubly reflected over and down along beam path 80 through ¼ wave plate 122 again, passing further along beam path 80 (parallel to beam path 81) to mirror 52 and beam f1+/−2delta f passes back up along beam path 80 to the polarizing beam-splitting surface 130 where as a result of the effects of ¼ wave plate 122 it is reflected out along beam path 82 to the detector 84 with the latter beam interfering with the beam which took the other beam route from cube corner 125 to beam path 82 through cube 126.

Figure 16A:
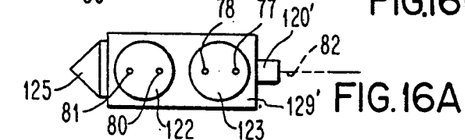
FIGS. 16A-16C show modifications of the interferometers of FIGS. 15A-15C.
Figure 16B:
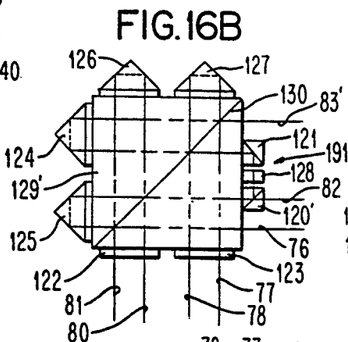
Figure 16C:
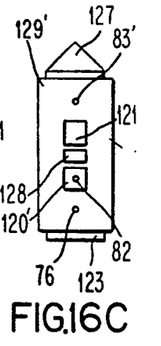

FIGS. 16A–16C show modifications of the interferometers of FIGS. 15A–15C. In general the operation is the same except that the 50% beam splitter has been moved up to the output of path 82. The beam polarized components. The beam 191 reflected upwardly passes through half wave plate 128 to rotate the combined beams 90 degrees and therefrom into the 90 degree beam bender 121 which sends the recombined f1 and f2 components of beam 191 through the second integrated interferometer. If component f1 was the reference component in beam 76, it will be the measurement component in beam 191, and vice versa. This has the effect of reversing the sign of the detected motion thereby allowing the second axis to be insensitive to translation since as the first axis increments by +df the second axis will decrement by −df giving a net of 0. This assumes that the mirror moves exactly the same amount for both axes. If it does not then the net will not=0 and therefore the stage must have rotated to produce the different paths. Therefore, we have an optical signal for Theta.

Figure 17A:
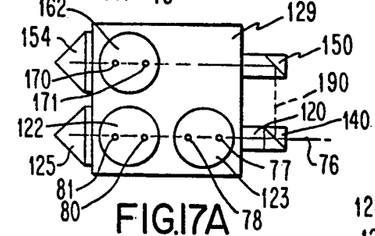
FIGS. 17A-17C show further modifications of the interferometers of FIGS. 15A-15C.
Figure 17B:
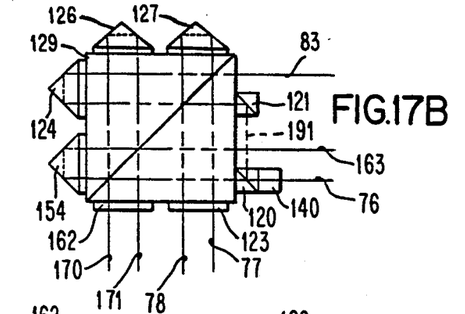
Figure 17C:
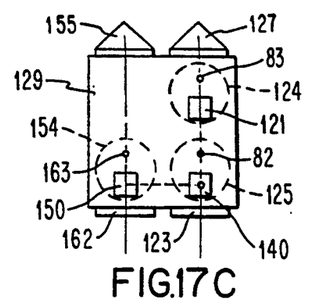

FIGS. 17A–17C show further modifications of the interferometers of FIGS. 15A–15C. In this case, a 33% beam splitter 140 precedes the 50% beam splitter 120. There are additional cube corners 154 and 155 and an additional 90 degree beam bender 150, as well as quarter wave plate 162 which all combine to measure pitch as well as position and yaw, measured by the prior systems.

Industrial Applicability this x-y positioning system is suitable for use by manufacturers and users of E-beam systems or similar kinds of systems in the semiconductor manufacturing industry. This x-y table positioning system is designed for use with an E-Beam system employed for exposure of lithographic masks for use for semiconductor manufacturing. These drive tables provide improved manufacturing tolerances well below those possible or required in the past.

What is claimed is:

1. A positioning stage comprising:
   a) a base having rectilinearly disposed x and y axes;
   b) a stage plate slideably supported on said base,
   c) at least three linear drive means rotatably engaging both said stage plate and rotatably engaging said base for moving said stage plate on a path with at least three separate drive displacements along said rectilinearly disposed x and y axes and rotation of said plate on said base substantially parallel to the surface of said base, said plate moving upon the surface of said base,
   whereby combined x, y rectilinear and rotary motions with respect to said base can be achieved.

2. The stage of claim 1 wherein
   a) a first one of said linear drive means is directed in a first direction substantially along said x axis,
   b) a second one of said linear drive means is directed substantially along said y axis transverse to the direction of said first linear drive means, and
   c) a third one of said linear drive means is substantially parallel to one of said first and second linear drive means for providing rotation through said angle theta, whereby displacement of said stage can be provided in the x, y and rotational directions of motion relative to said base as said three linear drive means independently operate to translate said stage through linear and/or rotary motion with respect to said base.

3. The stage of claim 1 wherein
a) each of said drive means on said base being independent and being connected to said stage plate for moving said stage plate as a function of the force of said drive means,
b) each of said drive means including
  1) a motor and a capstan driven by said motor,
  2) a drivebar and a pressure means,
  3) said capstan and said pressure means cooperating to drive said drivebar in response to said motor,
  4) said drivebar being pivotally mounted on said stage plate and frictionally engaged with said capstan by said pressure means;
  whereby rotation of each said capstan moves said stage plate along a path as a function of said at least three displacements provided by said independent drive means.

4. The stage of claim 2 wherein
a) each of said drive means on said base being independent and being connected to said stage plate for moving said stage plate as a function of the force of said drive means,
b) each of said drive means including
  1) a motor and a capstan driven by said motor,
  2) a drivebar and a pressure means,
  3) said capstan and said pressure means cooperating to drive said drivebar in response to said motor,
  4) said drivebar being pivotally mounted on said stage plate and frictionally engaged with said capstan by said pressure means;
  whereby rotation of each said capstan moves said stage plate along a path as a function of said at least three displacements provided by said independent drive means.

5. A positioning stage comprising:
a) a base having a surface;
b) a stage plate slideably supported on said surface of said base,
c) at least three linear drive means rotatably engaging said stage plate and rotatably engaging said base for moving said stage plate on a path with at least three separate drive displacement motions for moving said plate upon said surface of said base,
d) means for detecting the displacement of each of said linear drive means,
e) control electronics means for providing control signals having inputs connected to said means for detecting and having outputs connected to said linear drive means,
whereby combined x, y rectilinear and rotary motions with respect to said base can be achieved.

6. A positioning system in accordance with claim 5 including
an interferometer system including an integrated structure including a plurality of interferometer optical systems on a unitary element
said system including integrated, parallel, dual two axis plane mirror interferometers in said unitary element.

7. A positioning system wherein comprising:
a) a base having a surface;
b) a stage plate slideably supported on said surface of said base,
c) at least three linear drive means rotatably engaging said stage plate and rotatably engaging said base for moving said stage plate on a path with at least three separate drive displacement motions for moving said plate upon said surface of said base,
d) means for detecting the displacement of each of said linear drive means,
e) control electronics means for providing control signals having inputs connected to said means for detecting and having outputs connected to said linear drive means,
said means for detecting comprises,
  an interferometer system including an integrated structure including a plurality of interferometer optical systems on a unitary cubic element structure (129"),
  said element structure (129") comprising optically transparent material divided into halves and having six planar external surfaces including a first, a second, a third, a fourth, a fifth and a sixth side and composed of two bonded elements with a polarizing beam-splitting surface (130) at the junction between said two bonded elements, said first and second sides being in substantially parallel planes,
  a plurality of optical elements secured to said structure, said plurality of optical elements including a beam bender, a beam splitter, a first retroreflector (124), a second retroreflector (125), a third retroreflector (126), a fourth retroreflector (127), a first quarter wave element and a second quarter wave element,
  said plurality of optical elements combining to form at least a pair of interferometers aligned to be directed in parallel at a single retroreflecting mirror (52) on a surface whose linear and angular position is to be monitored,
  said first side of said structure (129") including secured thereto said beam bender (121) and said beam splitter (120) for receiving an input laser light beam (76) to be employed by said interferometers having a first optical path (176) directed directly into said first side of said structure (129") and a second optical path (191) directed along a path parallel to said first side towards said beam bender (121) which is positioned to receive a second portion of the beam split from said beam splitter and to bend said second portion directly along a third optical path (192, 193) into another site upon said first side, thereby directing said first and third optical paths in parallel towards said polarizing beam splitting surface (130),
  said first, second, third, and fourth parallel retroreflectors (124, 125 and 126, 127) having doubly reflecting surfaces for reflecting a beam parallel to its original path, said first and second retroreflectors (124, 125) being bonded to said second side of said structure on the opposite side of said structure from said first side of said structure (129") with said second retroreflector (125) being aligned with said first optical path (176) from said beam splitter (120), and said first retroreflector (124) being aligned with the said third optical path (192) from said beam bender (121), and said polarizing beam splitting surface (130) being located between said first side and said second side whereby beams (192, 176) with light from said first and third optical paths being reflected from said first and second retroreflectors (124, 125) pass through said beam splitting surface (130) from said first and second retroreflectors (125, 125) are directed back out of said structure (129") through said first side along fourth and fifth optical paths (83, 82), and the remaining portions of light from said first and third optical paths (176, 192) being reflected from said beam splitting surface (130) are directed along sixth and seventh optical paths (81, 78) through a third side of said structure (129") with said first and second quarter wave elements (122, 123) being secured to said third side in alignment with the deflection of light along said sixth and seventh optical paths respectively from said bender (121) and said splitter (120) being reflected from said splitting surface (130) respectively outside of said structure towards said mirror (52), said third side of said structure joining said first and second sides and lying generally in a plane normal to said first and second sides, said fourth side lying in a plane generally parallel to said third side, the reflection of light from the sixth and seventh optical paths (81,78) from said mirror (52) passing back along said sixth and seventh paths (80,77) returning along parallel paths through said first and second quarter wave elements (122,123) respectively and said beam splitting surface 130 to said fourth side, said fourth side of said structure (129") being located opposite from said third side, said third retroreflector (126) and said fourth retroreflector (127) being bonded to said fourth side and, said third and fourth retroreflectors (126, 127) having their axes aligned with the axes of said sixth and seventh optical paths respectively for receiving light passing through said structure (129") to reach said third and fourth retroreflectors (126 and 127) respectively, for reflection back down along eighth and ninth optical paths comprising parallel paths to the sixth and seventh optical paths via said quarter wave plates, respectively (122, 123) to said mirror (52) respectively for reflection therefrom respectively back along said eighth and ninth optical paths to said beam splitting surface (130) along said parallel paths, for reflection back up to said beam splitting surface (130) for reflection laterally along said fifth and fourth optical paths (82,83) respectively through said first side of said structure (129") on the same beam path as the reflections from said first and second retroreflectors (124, 125) respectively, whereby combined x, y rectilinear and rotary motions with respect to said base can be achieved.

8. A positioning system in accordance with claim 6 with said polarizing beam-splitting surface (130) of said structure (129") being positioned in a plane oriented diagonally with respect to the beams from said beam splitter (120) and said beam bender (121), wherein the horizontally polarized portion of the beam on said third optical path from said bender (121) is reflected down through said second quarter wave element (123) along said seventh optical path (78) to said mirror (52), and said horizontally polarized portion is reflected back to said fourth retroreflector (127) where said horizontally polarized portion is doubly reflected in said fourth retroreflector (127) over and down along said ninth optical path (77) parallel to said seventh path 78 to said mirror (52) until said horizontally polarized portion is reflected back up to said beam splitting surface (130) where said horizontally polarized portion is reflected because of polarization caused by two passes through said second quarter wave element (123) to pass out along said fourth optical path (83) to said second detector (85), also, with the two said optical paths leading to said fourth optical path (83) interfering with each other as a function of the distance of movement of the said mirror (52), the beam on said first optical path (76) from said beam splitter (120) for the second axis passes directly to said beam-splitting surface (130) where the vertically polarized portion of the beam on said first optical path (176) is partially transmitted to said second retroreflector (125), that vertically polarized portion of the beam is reflected back from said second retroreflector (125) out along said fifth optical path (82) to a first detector (84), the remaining, horizontally polarized portion of beam for the second axis on said first optical path (176) from said beam splitter (120) is partially reflected by the beam-splitting surface (130) down along said sixth optical path (81) to mirror (52) and back up said sixth optical path (81) and through to said third retroreflector (126) where said remaining, horizontally polarized portion is doubly reflected over and down along said eighth optical (80) to mirror (52) and back up along said eighth optical path (80) to the polarizing beam-splitting surface (130) where said remainnig, horizontally polarized portion is reflected out along said fifth optical path (82) to the first detector (84) with the latter waves interfering with the waves which took the other beam route to said fifth optical path (82) through said third retroreflector (126).

9. A positioning stage comprising:
a) a base;
b) a stage plate slideably supported on said base,
c) at least three linear drive means rotatably engaging both said stage plate and rotatably engaging said base for moving said stage plate on a path with at least three separate drive displacements along the rectilinearly disposed x and y axes and rotation of said plate on said base substantially parallel to the surface of said base, said plate moving upon the surface of said base,
d) each of said linear drive means including a ball type pivot joint with dynamic preload adjustment comprising
  1) a first member terminating in a ball for said joint,
  2) a pair of confronting bearing elements each including a bearing surface for one side of said ball, said ball being assembled between said bearing surfaces of said bearing elements,
  3) at least one of said bearing elements being connected to a preload actuator,
  4) a preload sensor attached to at least one of said bearing elements,
  5) servo control means having an input and an output, said input being connected to the output of said preload sensor, and said output being connected to said preload actuator,
  whereby said preload actuator is dynamically preloaded by operation of said servo control means in response to said preload sensor and combined x, y rectilinear and rotary motions with respect to said base can be achieved.

10. A stage in accordance with claim 9 wherein said bearing surfaces are conical.

11. A stage in accordance with claim 9 with said bearing elements including a relatively fixed bearing element and a relatively movable element, said relatively movable element including a pivot end, said pivot end being secured to said fixed bearing element and a main body end including said bearing surface, said main body end being joined to said pivot end by a flexible section of said movable element, said flexible section providing flexure of said movable element between said main body end and said pivot end.

12. A stage in accordance with claim 11 wherein said bearing surfaces are conical.

13. A stage in accordance with claim 9 with said bearing elements including a relatively fixed bearing element and a relatively movable element, said relatively movable element including a pivot end, said pivot end being integral with said fixed bearing element and a main body end including said bearing surface, said main body end being joined to said pivot end by a flexible section of said movable element, said flexible section providing flexure of said movable element between said main body end and said pivot end.

14. A stage in accordance with claim 13 wherein said bearing surfaces are conical.

15. A positioning system in accordance with claim 5 wherein said control electronics means includes means for adjusting the angle of rotation about an axis to a predetermined value.

16. A system in accordance with claim 15 wherein said control electronics adjusts the YAW angle about the 2 axis to near zero.

17. A positioning stage comprising:
a) a base having a surface;
b) a stage plate slideably supported on said surface of said base,
c) at least three linear drive means rotatably engaging said stage plate and rotatably engaging said base for moving said stage plate on a path with at least three separate drive displacement motions for moving said plate upon said surface of said base,
d) means for detecting the displacement of each of said linear drive means,
e) control electronics means for providing control signals having inputs connected to said means for detecting and having outputs connected to said linear drive means,
f) an interferometer system formed of a single solid, optically transparent cubic element as a part of an integral unitary optical system, comprising a transparent cube with a pair of two axis plane mirror interferometers formed upon said cubic element, said cube including first, second, third and fourth sides carrying optical elements secured thereto,
i) a first side of said cube including two input and two output optical ports with one each for each interferometer and means for providing two optical beams along two parallel optical paths into said cubic element, said two optical beams having been split from a single laser source, and
ii) a first cube corner and a second cube corner for each said interferometer bonded to said cube,
iii) a second side of said cube opposite from said first side and substantially parallel thereto supporting a first cube corner for each interferometer aligned with a corresponding one of said two optical beams, the portion of said two beams reaching said cube corners being reflected back to two corresponding output optical paths on said first side,
iv) a diagonal polarizing beam splitting surface between said first and said second sides and between said third and said fourth sides of said cube for splitting said two optical beams according to polarization,
v) a third side of said cube connecting between said first side and said second side and substantially parallel thereto supporting said second cube corner for each interferometer,
vi) a fourth side of said cube with at least one quarter wave plate thereon aligned with the reflection paths from said beam splitting surface, and
vii) a mirrored surface aligned to receive and reflect beams back towards said fourth side along said reflection paths back towards and through said beam splitting surface back up to said cube corners on said third side for reflection back down again to said mirror along a parallel path and back up to said beam splitting surface for reflection back out through a said corresponding output optical paths on said first side,
whereby combined x, y rectilinear and rotary motions with respect to said base can be achieved, and signals representing position, and pitch are provided for measurement.

18. A positioning stage comprising:
a) a base having a surface;
b) a stage plate slideably supported on said surface of said base,
c) at least three linear drive means rotatably engaging said stage plate and rotatably engaging said base for moving said stage plate on a path with at least three separate drive displacement motions for moving said plate upon said surface of said base,
d) means for detecting the displacement of each of said linear drive means,
e) control electronics means for providing control signals having inputs connected to said means for detecting and having outputs connected to said linear drive means,
f) an interferometer system formed of a single solid, optically transparent cubic element as a part of an integral unitary optical system, comprising a transparent cube with three two axis plane mirror interferometers formed upon said cubic element, said cube including first, second third and fourth sides carrying optical elements secured thereto,
i) a first side of said cube including three input and three output ports with one each for each interferometer and means for providing three optical beams along three parallel optical paths into said cubic element, said three optical beams having been split from a single laser source, and
ii) a first cube corner and a second cube corner for each said interferometer bonded to said cube,
iii) a second side of said cube opposite from said first side and substantially parallel thereto supporting a first cube corner for each interferometer aligned with a corresponding one of said three optical beams, the portion of said three beams reaching said cube corners being reflected back to three corresponding output optical paths on said first side, iv) a diagonal polarizing beam splitting surface between said first and said second sides and between said third and said fourth sides of said cube for splitting said three optical beams according to polarization, v) a third side of said cube connecting between said first side and said second side and substantially parallel thereto supporting said second cube corner for each interferometer, vi) a fourth side of said cube with at least one quarter wave plate thereon aligned with the reflection paths from said beam splitting surface, and vii) a mirrored surface aligned to receive and reflect beams back towards said fourth side along said reflection paths back towards and through said beam splitting surface back up to said cube corners on said third side for reflection back down again to said mirror along a parallel path and back up to said beam splitting surface for reflection back out through a said corresponding output optical paths on said first side, whereby combined x, y rectilinear and rotary motions with respect to said base can be achieved, and signals representing position, pitch and yaw are provided for measurement.

19. A positioning stage comprising:
a) a base having a rectilinearly disposed x and y axes,
b) a stage plate slideably supported on said base free from connection to any guide track for rectilinear guidance,
c) at least three linear drive means rotatably engaging both said stage plate only at one end thereof and rotatably engaging said base for moving said stage plate on a path with at least three separate drive displacements along said rectilinearly disposed x and y axes and rotation of said plate on said base substantially parallel to the surface of said base, said plate moving upon the surface of said base, whereby combined x, y rectilinear and rotary motions with respect to said base can be achieved.

20. The stage of claim 19 wherein
a) a first one of said linear drive means is directed in a first direction substantially along said x axis,
b) a second one of said linear drive means is directed substantially along said y axis transverse to the direction of said first linear drive means, and
c) a third one of said linear drive means is substantially parallel to one of said first and second linear drive means for providing rotation through said angle theta, whereby displacement of said stage can be provided in the x, y and rotational directions of motion relative to said base as said three linear drive means independently operate to translate said stage through linear and/or rotary motion with respect to said base.

21. The stage of claim 19 wherein
a) each of said drive means on said base being independent and being connected to said stage plate for moving said stage plate as a function of the force of said drive means,
b) each of said drive means including
  1) a motor and a capstan driven by said motor,
  2) a drivebar and a pressure means,
  3) said capstan and said pressure means cooperating to drive said drivebar in response to said motor,
  4) said drivebar being pivotally mounted on said stage plate and frictionally engaged with said capstan by said pressure means;
whereby rotation of each said capstan moves said stage plate along a path as a function of said at least three displacements provided by said independent drive means.

22. The stage of claim 20 including
a) each of said drive means on said base being independent and being connected to said stage plate for moving said stage plate as a function of the force of said drive means,
b) each of said drive means including
  1) a motor and a capstan driven by said motor,
  2) a drivebar and a pressure means,
  3) said capstan and said pressure means cooperating to drive said drivebar in response to said motor,
  4) said drivebar being pivotally mounted on said stage plate and frictionally engaged with said capstan by said pressure means;
whereby rotation of each said capstan moves said stage plate along a path as a function of said at least three displacements provided by said independent drive means.

23. A positioning stage comprising:
a) a base having a surface;
b) a stage plate slideably supported on said surface of said base free from connection to any rectilinear guide track,
c) at least three linear drive means,
  1) each of said drive means rotatably engaging said stage plate only at one end of said drive means and
  2) each rotatably engaging said base for moving said stage plate on a path with at least three separate drive displacement motions for moving said plate upon said surface of said base,
d) means for detecting the displacement of each of said linear drive means,
e) control electronics means for providing control signals having inputs connected to said means for detecting and having outputs connected to said linear drive means,
whereby combined x, y rectilinear and rotary motions with respect to said base can be achieved.

* * * * *